United States Patent
Floyd

(10) Patent No.: US 6,238,944 B1
(45) Date of Patent: May 29, 2001

(54) BURIED HETEROSTRUCTURE VERTICAL-CAVITY SURFACE-EMITTING LASER DIODES USING IMPURITY INDUCED LAYER DISORDERING (IILD) VIA A BURIED IMPURITY SOURCE

(75) Inventor: Philip D. Floyd, Sunnyvale, CA (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/471,746

(22) Filed: Dec. 21, 1999

(51) Int. Cl.[7] .................................................. H01L 21/00
(52) U.S. Cl. ............................................... 438/45; 438/46
(58) Field of Search ................................. 438/36, 45, 46, 438/47, 511, 542, 543, 550; 257/14, 15, 22; 372/43, 46

(56) References Cited

U.S. PATENT DOCUMENTS

| | | | |
|---|---|---|---|
| 5,915,165 | 6/1999 | Sun et al. | 438/47 |
| 6,061,380 * | 5/2000 | Jiang et al. | 372/96 |

* cited by examiner

Primary Examiner—Keith Christianson
(74) Attorney, Agent, or Firm—William Propp

(57) ABSTRACT

The barrier layers within a quantum well active region of a vertical cavity surface emitting laser can be silicon doped. Under thermal annealing, the silicon doped barrier layers will form disordered regions of the quantum well active region around the remaining non-disordered regions of the quantum well active region. The disordered regions of the quantum well active region will prevent diffusion of injected carriers from the non-disordered, light emitting quantum well active region.

8 Claims, 3 Drawing Sheets

BURIED HETEROSTRUCTURE VERTICAL-CAVITY SURFACE-EMITTING LASER DIODES USING IMPURITY INDUCED LAYER DISORDERING (IILD) VIA A BURIED IMPURITY SOURCE

BACKGROUND OF THE INVENTION

The present invention relates to a vertical cavity surface emitting laser and, more particularly, to a buried impurity source in the barrier layers of the quantum well active region of a vertical cavity surface emitting laser, which after thermal annealing, will diffuse portions of the quantum well active region to laterally confine injected carriers to the non diffused active regions.

Monolithic arrays of solid state semiconductor lasers are very desirable light sources for high-speed laser printing, optical fiber communications and other applications. Recently, there has been an increased interest in vertical cavity surface emitting lasers ("VCSEL's") although edge emitting lasers are currently used in the vast majority of applications. A common laser structure is a so-called "edge emitting laser" where light is emitted from the edge of a monolithic structure of semiconductor layers. Another type of laser structure is a "VCSEL" where the light is emitted from the surface of the monolithic structure of semiconductor layers.

One reason for the interest in VCSEL's is that edge emitting lasers produce a beam with a large angular divergence, making efficient collection of the emitted beam more difficult. Furthermore, edge emitting lasers cannot be tested until the wafer is cleaved into individual devices, the edges of which form the mirror facets of each device. On the other hand, not only does the beam of a VCSEL have a small angular divergence, a VCSEL emits light normal to the surface of the wafer. In addition, since VCSEL's incorporate the mirrors monolithically in their design, they allow for on-wafer testing and the fabrication of one-dimensional or two-dimensional laser arrays.

One method to fabricate a VCSEL is taught in U.S. Pat. No. 5,915,165 to Sun et al., commonly assigned as the present application and herein incorporated by reference. Several disordering semiconductor layers are deposited adjacent to the active layers during deposition of a laser semiconductor structure. Annealing causes these "buried" disordering layers to spread among the other semiconductor layers to form disordered regions that will bound the vertical laser cavity.

The performance of VCSEL's has improved substantially in recent years. However, the ultimate performance of these improved VCSEL structures may be limited by losses associated with the diffusion of injected carriers laterally out of and away from the active light emitting region of the VCSEL. These losses increase the threshold current of the laser required for light emission from the active region and prevent simple scaling down of the VCSEL size to result in lower current requirements for light emission from the active region of the VCSEL.

It is an object of this invention to provide better definition of the active region of a VCSEL to prevent lateral injected carrier diffusion and decrease the threshold current requirement for light emission from the active region of the VCSEL.

SUMMARY OF THE INVENTION

According to the present invention, the barrier layers within a quantum well active region of a vertical cavity surface emitting laser can be silicon doped. Under thermal annealing, the silicon doped barrier layers will form disordered regions around the remaining non-disordered active regions. The disordered regions of the quantum well active region will prevent diffusion of injected carriers from the non-disordered, light emitting quantum well active region.

Other objects and attainments together with a fuller understanding of the invention will become apparent and appreciated by referring to the following description and claims taken in conjunction with the accompanying drawings.

DETAILED DESCRIPTION OF THE INVENTION

Figure 1:
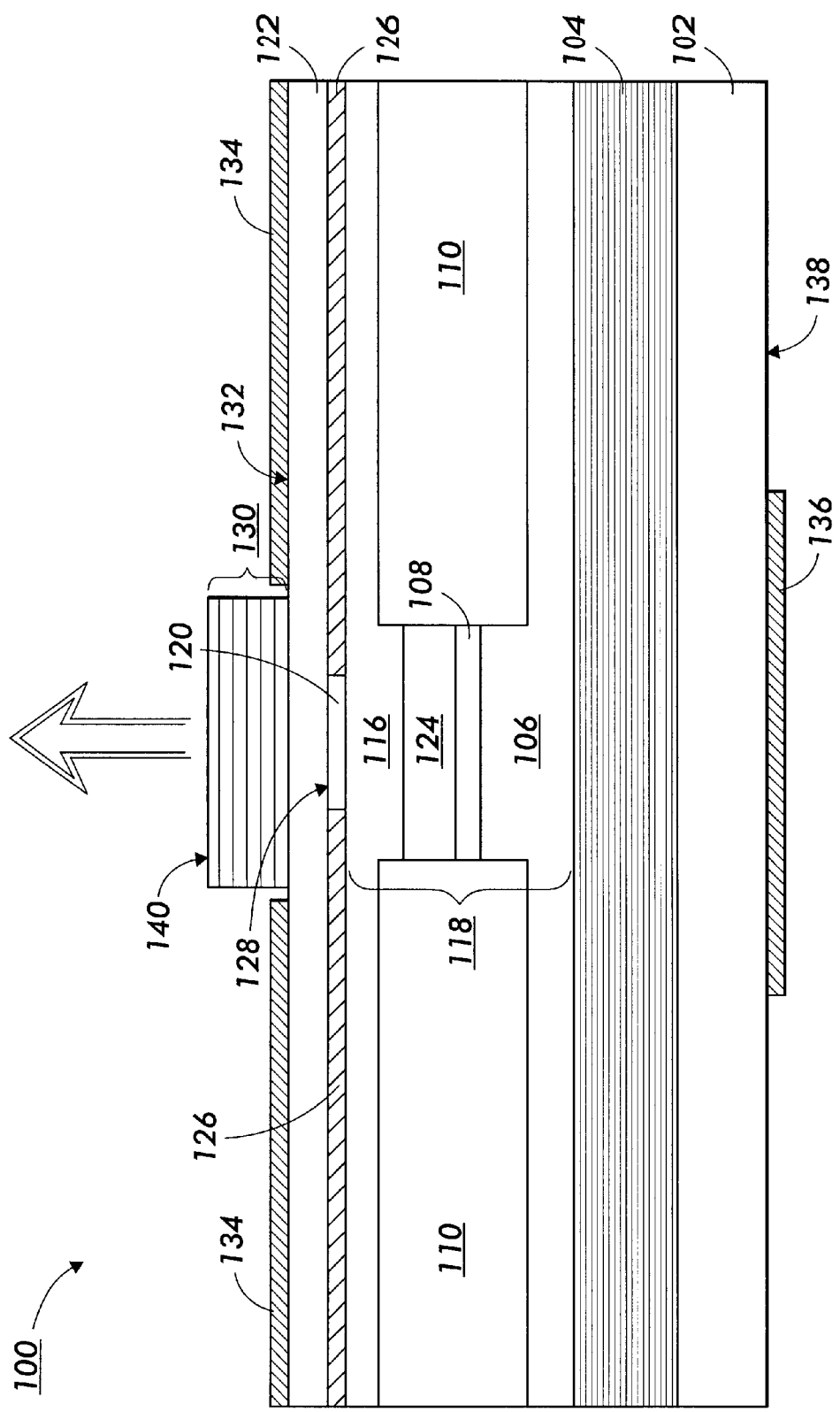
FIG. 1 illustrates a side view of the vertical cavity surface emitting laser with buried impurity source in the barrier layers of the quantum well active region of the present invention.

Reference is now made to FIG. 1, wherein there is illustrated a vertical cavity surface emitting laser 100 with a buried impurity source in the barrier layers of the quantum well active region as an embodiment of the present invention.

The laser heterostructure 100 includes a number of semiconductor layers formed by an epitaxial process such as metal-organic chemical vapor deposition ("MOCVYD"), liquid phase epitaxy ("LPE"), molecular beam epitaxy ("MBE"), or other known crystal growth processes.

The vertical cavity surface emitting laser structure 100 includes a highly doped n-type GaAs substrate 102, whose doping is typically around the range of $3\times10^{18}$ cm$^3$ to $7\times10^{18}$ cm$^{-3}$, on which is deposited a n-type superlattice structure 102 forming a lower distributed Bragg reflector ("DBR"). This lower DBR provides the necessary internal reflection in a VCSEL structure. If desired, a buffer layer (not shown) of n-type GaAs doped around the range of $3\times10^{18}$ cm$^3$ to $7\times10^{18}$ cm$^{-3}$ of about 0.5 µm thickness may be deposited between the substrate 100 and the superlattice structure 104.

The lower DBR 104 is typically formed by multiple pairs of an $Al_xGa_{1-x}As$ layer with a high aluminum content and another $Al_yGa_{1-y}As$ layer with a low aluminum content. A typical thickness of each layer pair is approximately 120 nanometers for a laser emitting at 820 nanometers. The total thickness of each layer pair is designed to be equal to one half of the optical wavelength at the intended wavelength of laser operation. The desired wavelength of laser operation is typically in the range of 670 to 980 nanometers.

The $Al_xGa_{1-x}As$ layer with a high aluminum content contains approximately 86% aluminum. The aluminum content of the $Al_xGa_{1-x}As$ layer with a high aluminum content should be sufficiently high to provide for a low refractive index, but not so high as to oxidize easily. The $Al_yGa_{1-y}As$ layer with a low aluminum content has an aluminum content of approximately 16%. The composition of the $Al_yGa_{1-y}As$ layer with a low aluminum content should typically have sufficient aluminum so that it is non-absorptive at the lasing wavelength. It should also be sufficiently low so that the material achieves a desired refractive index. The lower DBR mirror 104 is n-doped nominally at about of $1\times10^{18}$ cm$^{-3}$ with higher doping of up to $5\times10^{18}$ cm$^{-3}$ at the interfaces between semiconductor layers.

After the growth of a number of layer pairs, a final $Al_xGa_{1-x}As$ layer with a high aluminum content is deposited before growing the first spacer layer 106 of the optical cavity. The thickness of the final high aluminum content layer is designed to be a quarter of the optical wavelength at the intended wavelength of laser operation.

Under this embodiment, since light is emitted through the top surface of the semiconductor sample, the reflectivity of the lower DBR 104 should be as close to 100% as possible in order to achieve high internal reflection. High internal reflection generally reduces the threshold current of a laser. It is well-known that the reflectivity of the lower DBR 104 is generally a function of the difference in the refractive indices between the two AlGaAs layers of the superlattice and the number of layer pairs in the structure. The greater the difference in the refractive indices, the fewer the number of pairs required. Typically, 30 to 40 pairs of AlGaAs layers are used to form the lower DBR structure 104.

After the lower DBR structure 104 has been deposited epitaxially, a n-$Al_{0.5}Ga_{0.5}As$ cladding layer 106 is deposited. This lower AlGaAs cladding layer 106 is n-type with a doping level of $1\times10^{18}$ cm$^{-3}$ to $5\times10^{18}$ cm$^{-3}$. Its thickness is approximately 100 nanometers.

Above this AlGaAs cladding layer 106 is deposited the active region 108 of the laser structure for light emission.

Figure 2:
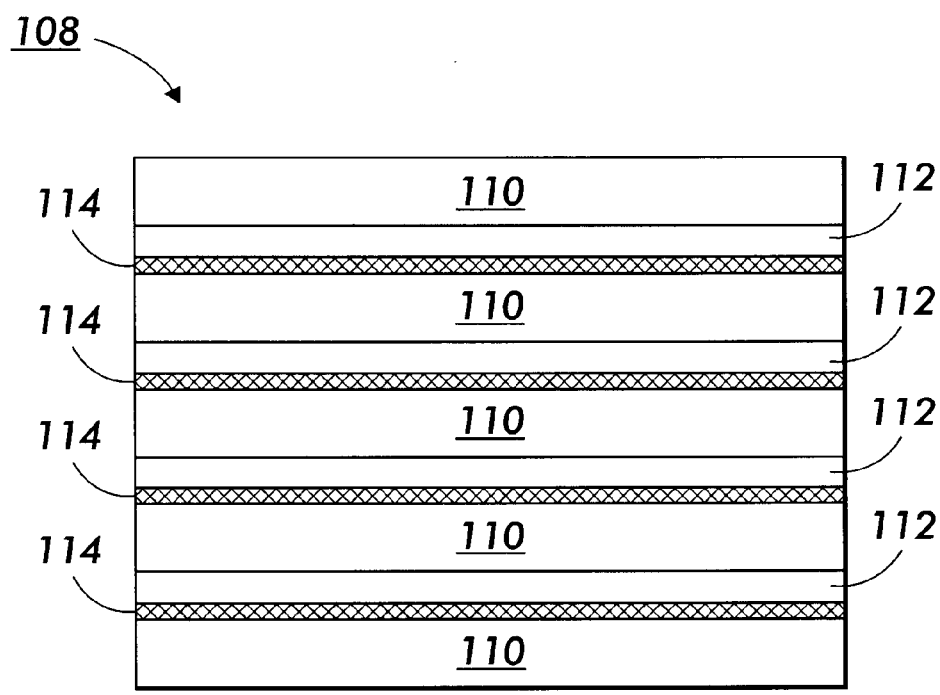
FIG. 2 illustrates a side view of the active region of the vertical cavity surface emitting laser with buried impurity source in the barrier layers of the quantum well active region of FIG. 1.

As best seen in FIG. 2, the multiple quantum well active region 108 has five barrier layers 110 alternating with four quantum well layers 112. The barrier layers 110 are $Al_AGa_{1-A}As$ where the aluminum content A is in the range of 0.1 to 0.4, most typically at 0.35. Each barrier layer has a thickness of two to eight nanometers. The barrier layers 110 are n-doped with silicon around the range of $3\times10^{18}$ cm$^{-3}$ to $7\times10^{18}$ cm$^{-3}$ for 50 angstroms on one side of the quantum well layer 112 to form a doped region 114. Alternately, not shown in this Figure, the barrier layers can be Si-doped to a depth of 50 angstroms on both sides of the quantum well layer. Also, the barrier layers can alternatively be AlAs.

The quantum well layers 112 are pure GaAs or AlGaAs or InGaAs, depending upon the desired output wavelength of the VCSEL structure 100. Under this embodiment, these quantum wells are typically formed by undoped $Al_BGa_{1-B}As$ with an aluminum content B in the range under 0.1, most typically at 0.07. Each quantum well layer has a thickness of five to ten nanometers. Nothing in this invention prevents the use of other multiple quantum well structures ("MQW") to form the active region 106. As a general rule with aluminum gallium arsenide barrier layers and active quantum well layers, the aluminum gallium arsenide barrier layers will have a higher aluminum content and a lower gallium content than the aluminum gallium arsenide active quantum well layers.

Returning to FIG. 1, above the active region 108 is an upper p-$Al_{0.5}Ga_{0.5}As$ cladding layer 116, which is structurally similar to the lower n-AlGaAs cladding layer 106 except for the polarity of its dopants. This upper cladding layer 116 is p-type with a doping level of $1\times10^{18}$ cm$^{-3}$ to $4\times10^{18}$ cm$^{-3}$. Similar to the lower AlGaAs cladding layer 106, the thickness of top cladding layer 116 is also about 100 nanometers. These two AlGaAs cladding layers, 106 and 116, along with the active region 108 generally form the optical laser cavity 118 in which the desired optical gain can be attained. The total thickness of layers 106, 108, and 116 is adjusted to be equal to an integer multiple of the intended wavelength of laser operation.

Above the upper AlGaAs cladding layer 116 is deposited an AlAs oxidation layer 120, which is used to form the laser aperture. The laser aperture controls the current flow and thus the lasing location in the active region 108. Typically, this AlAs oxidation layer 120 has an aluminum content of approximately 95% and a thickness of about 70 nanometers.

Above the oxidation layer 120 is deposited a p+GaAs contact layer 122, which is nominally 5 nm thick, for the formation of p-type contacts for the VCSEL structure.

After all the semiconductor layers have been deposited, a silicon nitride layer is deposited on the surface of the semiconductor structure and is photolithographically formed into a capping mask. The capping mask overlies the location where the disordered regions for current confinement are to be formed and defines its configuration, as will be described below. The n-type disordering agent, created by the silicon dopants in the disordering barrier layers 110 of the quantum well active regions 108 generates Group III vacancies in these layers. During the IILD process, the semiconductor structure 100 is placed in a furnace and elevated into the range of about 800 to 900 degrees C. for several (about ten) hours to allow intermixing of the Group III elements, gallium and aluminum, to occur under the silicon nitride cap. In the regions outside of the nitride cap, arsenic outdiffuses causing Group V vacancies to increase. But since the number of Group III vacancies (V.sub.V) times the number of Group III vacancies (V.sub.III) must remain constant (V.sub.V.times.V.sub.III=k), as the Group V vacancies increase due to arsenic outdiffusion, the number of Group III vacancies decrease thus reducing the capability of these regions to intermix. Intermixing will be confined to the disordered regions 124 of the active region 108 and the cladding layers 106 and 116 under the cap.

During the intermixing process in the region 124, the aluminum composition decreases and the gallium composition increases in the layer 110, which originally had a high aluminum content, while conversely the aluminum composition increases and the gallium composition decreases in the layers 112, 106 and 116 which originally had a low aluminum content. Thus, after a typical IILD) process, the region 124 has an average aluminum content of less than about 95%. Minimal intermixing of Group III elements occurs in the regions outside of the silicon nitride cap.

After the layer disordering process has been completed, a silicon dioxide layer is deposited on the surface of the semiconductor structure. The silicon dioxide layer is masked to define the circular area of the aperture and an etching process is performed to expose the edges of the AlAs layer 120 for the next step, oxidation.

The oxidation environment is water vapor at a temperature of 400 to 500 degrees C. The oxidation rate of AlAs is about 1.5 .mu.m per minute at 450 degrees C. while it is about 0.05 .mu.m per minute for AlGaAs with about 95 percent aluminum and about 0.01 .mu.m per minute for AlGaAs with about 80 percent aluminum. Due to this significant difference in the oxidation rates, oxidation slows down substantially when it reaches the interface between the AlAs layer 120 and the AlGaAs cladding layer 116 and the interface between the AlAs layer 120 and the GaAs contact layer 122. The oxidized regions 126 will surround and define the non-oxidized Alas layer aperture 128.

After the oxidation process has been completed, the silicon nitride cap and the silicon dioxide masking layer are removed. The upper reflector for the VCSEL structure 100 of a dielectric mirror stack 130 is then formed on the top surface 132 of the contact layer 122 by vapor deposition.

The dielectric mirror 130 is composed of alternating layers of a low index of refraction dielectric material and a high index of refraction dielectric material. An example for the dielectric mirror are six alternating layers of quarter wavelength thick low index of refraction $Al_2O_3$ and high index of refraction $TiO_2$, as is known in the art. Other low index of refraction dielectric materials would include $SiO_2$, and other high index of refraction dielectric materials would include magnesium flouride and zirconium oxide.

The stack is aligned with the non-disordered section of the active region 108 and aligned with the aperture 128. The dielectric mirror provides a high level of reflectivity for the laser cavity and may be about 95% reflectivity.

Finally, upper annular p-type contacts 134 of titanium/gold are formed around the top surface area top surface 132 of the contact layer 122, and a lower n-type contact 136 of germanium/gold is formed on the bottom surface 138 of the substrate 102 of the semiconductor structure 100.

Current flowing from the p-contact 134 through the laser cavity 118 to the n-contact 136 will cause light emission from the active layer 108 through the aperture 128 through the upper surface 140 of the vertical cavity surface emitting laser structure 100 of FIG. 1.

The surrounding disordered regions 124 define the smaller non-disordered active region 108 in the laser cavity 118 for light emission. The disordered regions form a lateral heterobarrier for carriers in the active region and prevent the carriers from diffusing and not contributing to the light emission from the non-disordered active region.

The non-oxidized aperture 128 offers both electrical and optical confinement in a VCSEL because the surrounding oxide layer 126 is electrically insulating and has an adequately low refractive index of approximately 1.6.

Figure 3:
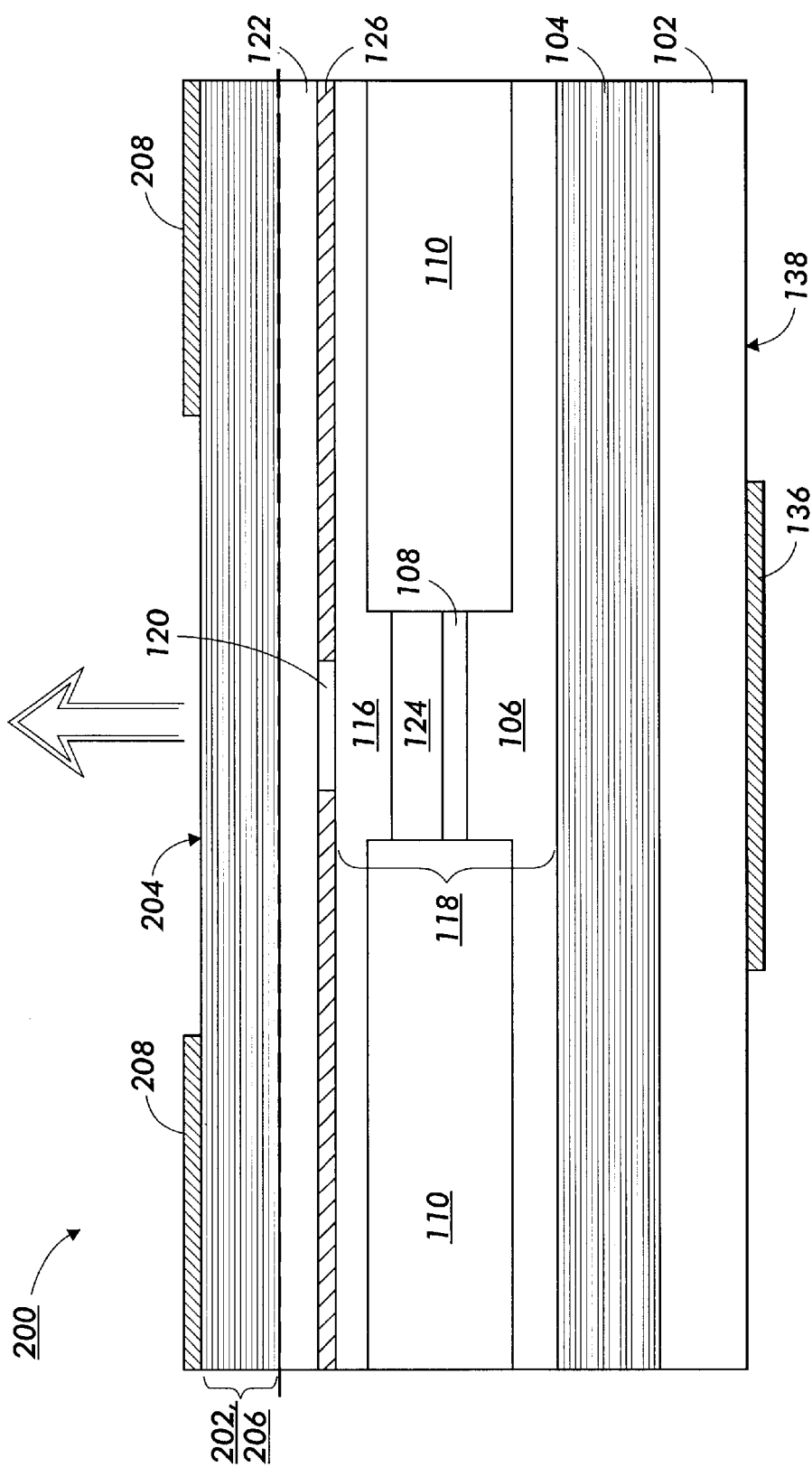
FIG. 3 illustrates a side view of a second embodiment of the vertical cavity surface emitting laser with buried impurity source in the barrier layers of the quantum well active region of the present invention.

Reference is now made to FIG. 3, wherein there is illustrated a vertical cavity surface emitting laser 200 with a buried impurity source in the barrier layers of the quantum well active region as an embodiment of the present invention.

The semiconductor layers of the structure and epitaxial deposition and impurity induced layer disordering method of fabrication of the VCSEL 200 of FIG. 3 are the same as the VCSEL 100 of FIG. 1 except that after layer disordering, the lateral oxidation step is postponed.

After disordering, the silicon nitride cap is removed. Then, on the contact layer 122 is deposited a p-type superlattice structure 202 which forms an upper DBR mirror. The upper DBR mirror 202 is structually similar to the lower DBR mirror 104 with the same multiple pairs of an $Al_xGa_{1-x}As$ layer with a high aluminum content and another $Al_yGa_{1-y}As$ layer with a low aluminum content, except for the polarity of its dopants. The upper DBR mirror 120 is p-doped nominally at about of $1\times10^{18}$ cm$^{-3}$ with higher doping of up to $5\times10^{18}$ cm$^{-3}$ at the interfaces between semiconductor layers.

Additionally, the $Al_xGa_{1-x}As$ mirror layer closest to each side of the active region 108 generally has a high aluminum content. In this embodiment, the reflectivity of the upper DBR 202 is typically only 98% to 99% because light will be emitted through the surface 204 of the semiconductor structure 200 through the upper DBR 202. Typically, 20 to 25 pairs of alternate AlGaAs layers are used to form this upper DBR mirror 202.

Then, a silicon dioxide layer (not shown) is deposited on the surface 204 of the semiconductor structure 200 of FIG. 3. The silicon dioxide layer is masked and an etching process is performed down to the oxidation layer 120 forming a mesa structure 206 of the upper DBR 202, the contact layer 122 and the oxidation layer 120, as shown in FIG. 3. This exposes the edges of the AlAs layer 120 for the next step, oxidation.

Oxidation proceeds in the VCSEL 200 of FIG. 3 just the same as the VCSEL 100 of FIG. 1 to form an aperture 128 from the non-oxidized AlAs layer. After oxidation, the silicon dioxide layer is removed Finally, upper annular )type contacts 208 of titanium/gold are formed around the top surface area 204 of the upper DBR 202 of the laser cavity 118, and a lower n-type contact 138 of germanium/gold is formed on the bottom surface 140 of the substrate 102 of the semiconductor structure 200.

Current flowing from the p-contact 208 through the laser cavity 118 to the n-contact 138 will cause light emission from the active layer 108 through the aperture 128 through the upper surface 204 of the vertical cavity surface emitting laser structure 100 of FIG. 1.

The VCSEL structure 200 of FIG. 3 merely substitutes a DBR for a dielectric mirror stack, postpones oxidation and moves the p-contacts onto the DBR in comparison to the VCSEL structure 100 of FIG. 1.

Generally, the dielectric mirror of the present invention comprises numerous layers alternating between different low and high refractive index materials to form a total of, for example, between about 2 and about 70 layers. More typically, the mirrors comprise between about 35 and about 60 layers. These dielectric mirror layers comprise conventional dielectric mirror materials. The broad band mirror should reflect at least about 90 percent of the impinging light over the range of wavelengths emitted by the active layer. The thickness of the mirror is not particularly critical. Typical materials employed in the dielectric mirror layer include, for example, zinc sulfide, cryolite, magnesium fluoride, and the like.

Discussion herewithin was confined to impurity induced disordering. However, it should be noted that there are alternate conventional techniques and diffusion/implant species for carrying out the desired disordering or the elemental implant/annealing technique. These other techniques and elemental diffusions or implants are equally applicable.

The invention is not limited to the use of Si as the impurity for inducing layer intermixing. Other impurities behave similarly to promote layer intermixing, such as Ge, Zn, Sn and Se.

The composition, dopants, doping levels, and dimensions given above are exemplary only, and variations in these parameters are permissible. Additionally, other layers in addition to the ones shown in the figures may also be included. Variations in experimental conditions such as temperature and time are also permitted. Lastly, instead of GaAs and AlGaAs, other semiconductor materials such as GaAlSb, InAlGaP, or other III–V alloys may also be used.

While the invention has been described in conjunction with specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A method for forming a surface emitting laser including the steps of providing a substrate;

depositing a plurality of semiconductor layers on said substrate, said plurality of semiconductor layers including;

a lower mirror; and an active region having a plurality of alternating quantum well layers and barrier layers, said barrier layers being impurity doped for disordering;

forming a capping mask upon a portion of the surface of said plurality of semiconductor layers;

annealing said capped plurality of semiconductor layers to cause intermixing of a first region of said disordering barrier layers and said quantum well layers under the capping mask, while leaving a second region of said disordering barrier layers and said quantum well layers to remain unintermixed;

etching said plurality of semiconductor layers to expose the edges of said plurality of semiconductor layers; and oxidizing one of said plurality of semiconductor layers to surround and form an aperture from said non-oxidized semiconductor layer;

depositing an upper mirror; and depositing electrodes for passing current through said second region of unintermixed quantum well layers causing light emission from said second region of unintermixed quantum well layers through said aperture through said upper mirror.

2. The method for forming a surface emitting laser as set forth in claim 1 wherein said lower mirror is a n-doped distributed Bragg reflector, said upper mirror is an undoped dielectric mirror, said plurality of quantum well layers is undoped, and said plurality of disordering barrier layers is n-doped.

3. The method for forming a surface emitting laser as set forth in claim 1 wherein said plurality of disordering barrier layers is n-doped only partially into the surface of each of said plurality of disordering barrier layers on one side of each of said plurality of alternating quantum well layers.

4. The method for forming a surface emitting laser as set forth in claim 1 wherein said plurality of disordering barrier layers is n-doped only partially into the surface of each of said plurality of disordering barrier layers on both sides of each of said plurality of alternating quantum well layers.

5. A method for forming a surface emitting laser including the steps of providing a substrate;

depositing a plurality of semiconductor layers on said substrate, said plurality of semiconductor layers including;

a lower mirror, and an active region of a plurality of alternating quantum well layers and barrier layers, said barrier layers being impurity doped for disordering, forming a capping mask upon a portion of the surface of said plurality of semiconductor layers;

annealing said capped plurality of semiconductor layers to cause intermixing of a first region of said disordering barrier layers and said quantum well layers under the capping mask, while leaving a second region of said disordering barrier layers and said quantum well layers to remain unintermixed;

depositing an upper mirror, etching said plurality of semiconductor layers to expose the edges of said plurality of semiconductor layers;

oxidizing one of said plurality of semiconductor layers to surround and form an aperture from said non-oxidized semiconductor layer, depositing electrodes for passing current through said second region of unintermixed quantum well layers causing light emission from said second region of unintermixed quantum well layers through said aperture through said upper mirror.

6. The method for forming a surface emitting laser as set forth in claim 5 wherein said lower mirror is a n-doped distributed Bragg reflector, said upper mirror is an p-doped distributed Bragg reflector, said plurality of quantum well layers is undoped, and said plurality of disordering barrier layers is n-doped.

7. The method for forming a surface emitting laser as set forth in claim 5 wherein said plurality of disordering barrier layers is n-doped only partially into the surface of each of said plurality of disordering barrier layers on one side of each of said plurality of alternating quantum well layers.

8. The method for forming a surface emitting laser as set forth in claim 5 wherein said plurality of disordering barrier layers is n-doped only partially into the surface of each of said plurality of disordering barrier layers on both sides of each of said plurality of alternating quantum well layers.

* * * * *